(12) United States Patent
Liu et al.

(10) Patent No.: US 9,324,695 B2
(45) Date of Patent: Apr. 26, 2016

(54) METHOD OF TUNING COLOR TEMPERATURE OF LIGHT-EMITTING DEVICE

(71) Applicant: EPISTAR CORPORATION, Hsinchu (TW)

(72) Inventors: Chien-Liang Liu, Hsinchu (TW); Ming-Chi Hsu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 14/679,415

(22) Filed: Apr. 6, 2015

(65) Prior Publication Data
US 2015/0287701 A1    Oct. 8, 2015

(30) Foreign Application Priority Data
Apr. 7, 2014  (TW) .............................. 103112791 A

(51) Int. Cl.
*H01L 25/075* (2006.01)
*H01L 33/50* (2010.01)
*H01L 33/62* (2010.01)

(52) U.S. Cl.
CPC ......... *H01L 25/0753* (2013.01); *H01L 2224/14* (2013.01); *H01L 2933/0033* (2013.01); *H01L 2933/0041* (2013.01)

(58) Field of Classification Search
None
See application file for complete search history.

(56) References Cited

U.S. PATENT DOCUMENTS

2011/0062857 A1*  3/2011  Chang ..................... F21K 9/137
                                                    313/501
2011/0128611 A1*  6/2011  Lin ..................... G02B 6/0003
                                                    359/326

* cited by examiner

*Primary Examiner* — Seahvosh Nikmanesh
(74) *Attorney, Agent, or Firm* — Patterson & Sheridan, LLP

(57) ABSTRACT

A method of tuning color temperature of light-emitting device having an overall color temperature, comprising: providing a carrier; disposing at least two LED units on the carrier, wherein there is a space formed between the two LED units, and the overall color temperature of the light-emitting device is positively correlated to the space; and setting a predetermined temperature for the overall color temperature by adjusting the space.

10 Claims, 5 Drawing Sheets

METHOD OF TUNING COLOR TEMPERATURE OF LIGHT-EMITTING DEVICE

CROSS REFERENCE TO RELATED APPLICATION

This application claims the priority to and the benefit of TW application Ser. No. 103112791 filed on Apr. 7, 2014, and the content of which is hereby incorporated by reference in its entirety.

BACKGROUND OF THE DISCLOSURE

1. Technical Field

This present application relates to a method of tuning color temperature of light-emitting device, which is especially related to a method of tuning color temperature of light-emitting device having a space between the light-emitting diodes. The space and the overall color temperature of the light-emitting device are positively correlated.

2. Description of the Related Art

Following incandescent light, a light-emitting diode (LED) has gradually been considered as an alternative light source for the illumination markets to replace the traditional lightings because the LED is less power-consumption, more environmental protection, longevous, light and handy. Among them, those LEDs which can generate white light become the industry's priority for development.

In LED lighting technology, there are two types of white light-emitting diode (WLED). One is formed by using a blue LED chip and a red chip as lighting sources to excite the phosphor by blue chip to emit the yellow light and green light, and then mixing the blue, red, and green or yellow lights to generate the white light. Another is formed by using a blue LED chip as a lighting source to excite phosphor by blue chip to emit the yellow and green light, and then mixing the blue and green or yellow lights to generate the white light. These two kinds of WLEDs are slightly different in price and color temperature, but face the same problem that the color temperature is affected after the package process. Therefore, for better color rendering, output efficiency, and color uniformity, an effective method of tuning color temperature of the LED can expand the utilization of WLEDs.

Moreover, the LED may be further connected to other components in order to form a light-emitting device. The light-emitting device comprises a sub-mount carrying an electrical circuit, a solder formed above the sub-mount to bond the light-emitting device to the sub-mount and to electrically connect the substrate of the light-emitting device with the electric circuit on the sub-mount, and an electrical connection structure that electrically connects the electrode of the light-emitting device to the electric circuit on the sub-mount, wherein the sub-mount may be lead frame or large size mounting substrate in order to facilitate circuit design and heat dissipation.

SUMMARY OF THE DISCLOSURE

This present application relates to a method of tuning color temperature of light-emitting device.

A method of tuning color temperature of light-emitting device having an overall color temperature, comprising: providing a carrier; disposing at least two LED units on the carrier, wherein there is a space formed between the two LED units, and the overall color temperature of the light-emitting device is positively correlated to the space; and setting a predetermined temperature for the overall color temperature by adjusting the space.

For a better understanding of the purposes, characteristics, and advantages of the present application, there are preferred embodiments and their corresponding figures to illustrate as follows.

DETAILED DESCRIPTION OF THE PREFERRED EMBODIMENTS

Figure 1:
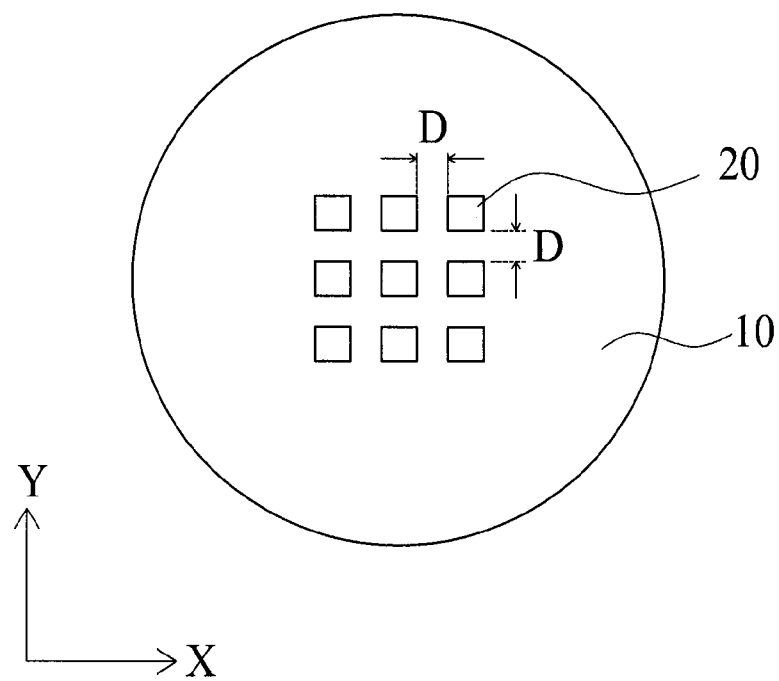
FIG. 1 shows a view of a light-emitting device disclosed in the embodiment of the present disclosure.

The embodiments of the present disclosure will be accompanied with the drawings to illustrate the concept of present disclosure. In the drawings or illustrations, similar or same units use the same reference character, a shape of the unit can be changed, and a thickness of the unit can be enlarged or reduced. It is noted that the units not illustrating or describing in the drawings can be general knowledge or ordinary skills in the art.

Figure 2:
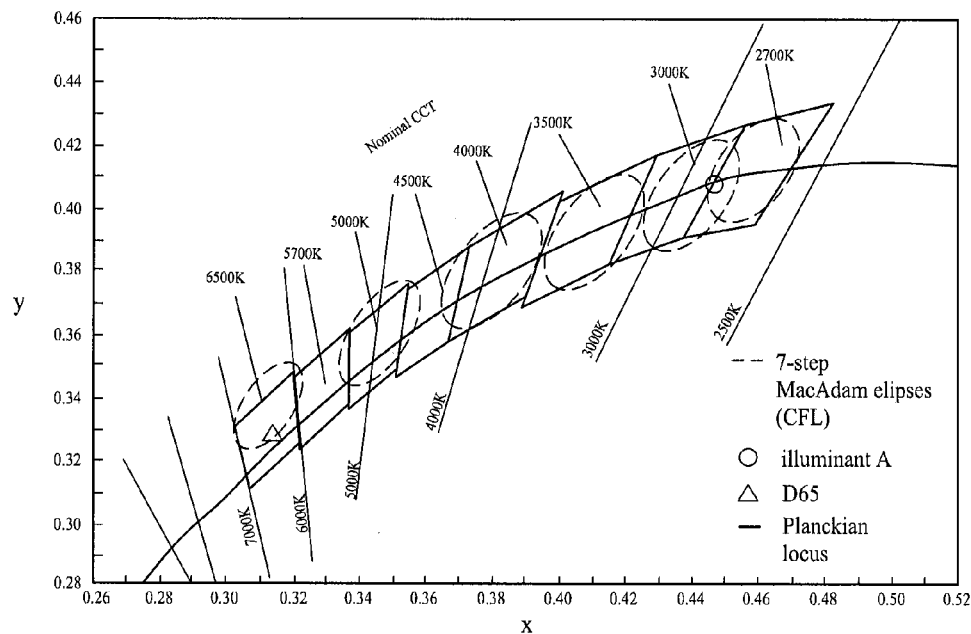
FIG. 2 shows a CIE 1931 chromaticity diagram with ANSI classified regions.

FIG. 1 shows a light-emitting device 100 disclosed in a first embodiment of the present disclosure. As FIG. 1 shows, a light-emitting device 100 includes a carrier 10 and a plurality of LED units 20 arranged on the carrier 10. There is a space D between every two adjacent LED units along X and Y axes. The space D and the overall color temperature of the light-emitting device 100 are positively correlated. In this embodiment, because of the positively correlated characteristic, by adjusting the space D, the overall color temperature of the light-emitting device 100 can be set to follow a predetermined temperature. It is noted that the predetermined temperature can be adjusted according to the practical application, and the range of the adjustment can comply with the color temperature standard of solid state lighting product made by American National Standards Institute (ANSI C78.377-2008). The color temperature standard of solid state lighting can be classified as eight regions: 2700K, 3000K, 4000K, 4500K, 5000K, 5700K, and 6500K. The eight regions in CIE 1931 chromaticity diagram can be referred to FIG. 2.

The following embodiments of present disclosure illustrate how the adjustment of the space between every two adjacent LED units can affect the overall color temperature. Table 1 shows Experiments 1 to 4 with different sizes, different types, and different spaces D of LED units. In each experiment of the embodiments, a single LED unit and four LED units arranged with different spaces (3 in series, 3 in parallel) arranged on a metal core printed circuit board (MCPCB) are tested respectively. Therein the types of LED units include standard of color temperature ranged from 5700K-6500K cold white LED units and standard of color temperature ranged from 2700K-3000K warm white LED units.

TABLE 1

| Experiment | LED unit size | LED unit type | Space D (mm) |
| --- | --- | --- | --- |
| Experiment 1 | 2 mm × 1 mm | Cold white light | Single chip 0.15、2、4、8 |
| Experiment 2 | 2 mm × 2 mm | Cold white light | Single chip 0.15、2、4、8 |
| Experiment 3 | 2 mm × 1 mm | Warm white light | Single chip 0.15、2、4、8 |
| Experiment 4 | 2 mm × 2 mm | Warm white light | Single chip 0.15、2、4、8 |

Experiment 1: The size of the LED unit is 2 mm*1 mm, the type of the LED unit is cold white LED, and the spaces D between every two adjacent LED units for test are 0 mm (a single LED unit), 0.15 mm, 2 mm, 4 mm, and 8 mm.

Table 2 shows the data of Experiment 1 including a single LED unit and four LED units arranged with different spaces. When the space D is increased from 0.15 mm to 8 mm, the overall color temperature is increased by about 340K while the flux of radiation is increased with the space D. The luminous flux variation stands little change and is about 0.2%.

TABLE 2

| | Experiment 1 | | | | | | | | | |
|---|---|---|---|---|---|---|---|---|---|---|
| Space [mm] | Luminous Flux variation [Lumen] | Flux of radiation [W] | Color temperature [K] | CIE x | CIE y | CIE u' | CIE v | Ra | Voltage [V] | Current [A] |
| Single chip | 39.83 | 0.13 | 6243 | 0.32 | 0.34 | 0.20 | 0.47 | 77.92 | 3.16 | 0.12 |
| 0.15 | 360.71 | 1.12 | 5914 | 0.32 | 0.35 | 0.20 | 0.48 | 78.30 | 9.25 | 0.36 |
| 2.0 | 362.84 | 1.13 | 6083 | 0.32 | 0.34 | 0.20 | 0.48 | 78.50 | 9.56 | 0.36 |
| 4.0 | 359.74 | 1.13 | 6299 | 0.32 | 0.34 | 0.20 | 0.47 | 78.90 | 9.27 | 0.36 |
| 8.0 | 360.20 | 1.14 | 6257 | 0.32 | 0.34 | 0.20 | 0.47 | 78.90 | 9.12 | 0.36 |

From the measurement result of Experiment 1, when the space is decreased, because the LED units are arranged more intensively, the heat dissipation is poor and thus the transfer efficiency of the LED units from blue light to white light is decreased, and results in the decrease of the luminous flux of radiation of the LED.

Figure 3:
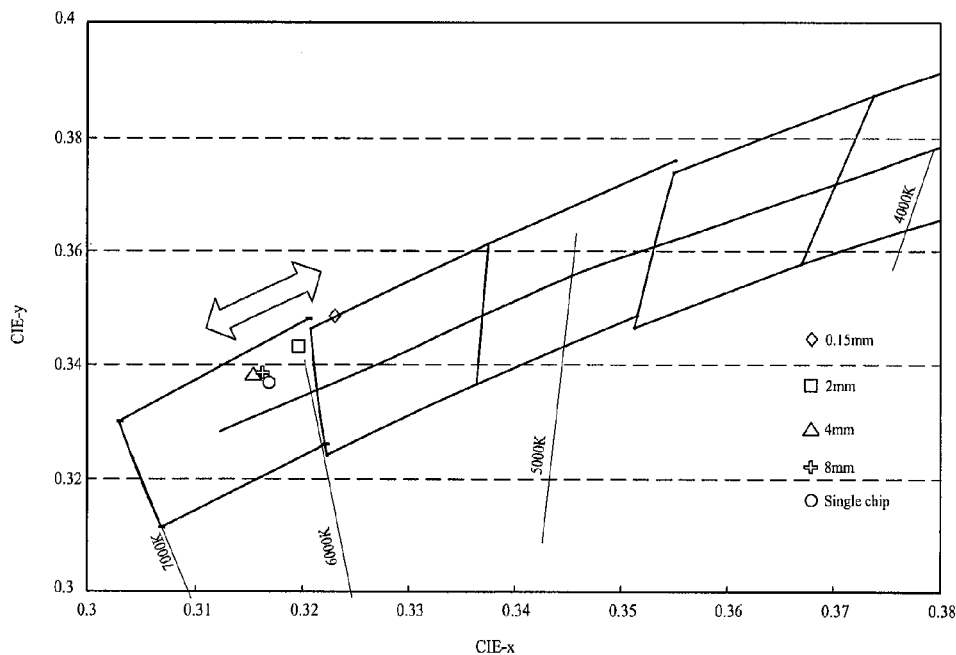
FIG. 3 shows a chromaticity diagram of first experiment disclosed in one embodiment of the present disclosure.

FIG. 3 shows a chromaticity diagram according to the data in Table 2. When the space is decreased, the overall color temperature is decreased; when the space is increased, the overall color temperature is gradually increased. Because the Experiment 1 uses cold white LED unit which has lower content of the fluorescent powder, the proportion of blue light is higher at lateral side. In this way, when the arrangement of LED units is more intensive and the space is smaller, it is much easier for the LED units to be affected by the fluorescent powder of adjacent LED unit to generate secondary absorption effect of blue light and results in the apparent drift and decrease of the overall color temperature comparing with the color temperature of single LED unit. Therefore, if comparing the color temperature of a single LED unit with the overall color temperature of four LED units arranged with different spaces in Experiment 1, the measurement result can confirm that by adjusting different spaces between every two adjacent LED units the overall color temperature can be adjusted effectively and the LED devices can be set to follow a predetermined temperature.

Experiment 2: The size of the LED unit is 2 mm*2 mm, the type of the LED unit is cold white LED, and the spaces D between every two adjacent LED units for test are 0 mm (a single LED unit), 0.15 mm, 2 mm, 4 mm, and 8 mm.

Table 3 shows the data of Experiment 2 including a single LED unit and four LED units arranged with different spaces. When the space D is increased from 0.15 mm to 8 mm, the overall color temperature is increased by about 200K while the flux of radiation is increased with the space D. The luminous flux variation stands little change and is about 3%.

TABLE 3

| | Experiment 2 | | | | | | | | | |
|---|---|---|---|---|---|---|---|---|---|---|
| Space [mm] | Luminous Flux variation [Lumen] | Flux of radiation [W] | Color temperature [K] | CIE x | CIE y | CIE u' | CIE v | Ra | Voltage [V] | Current [A] |
| Single chip | 125.53 | 0.37 | 5305 | 0.34 | 0.37 | 0.19 | 0.49 | 73.48 | 3.20 | 0.35 |
| 0.15 | 1097.12 | 3.14 | 5056 | 0.35 | 0.38 | 0.20 | 0.50 | 72.97 | 9.28 | 1.05 |
| 2.0 | 1104.96 | 3.19 | 5181 | 0.34 | 0.38 | 0.20 | 0.50 | 73.36 | 9.31 | 1.05 |
| 4.0 | 1123.17 | 3.26 | 5269 | 0.34 | 0.37 | 0.20 | 0.49 | 73.75 | 9.14 | 1.05 |
| 8.0 | 1140.81 | 3.31 | 5250 | 0.34 | 0.37 | 0.20 | 0.49 | 73.49 | 9.37 | 1.05 |

Figure 4:
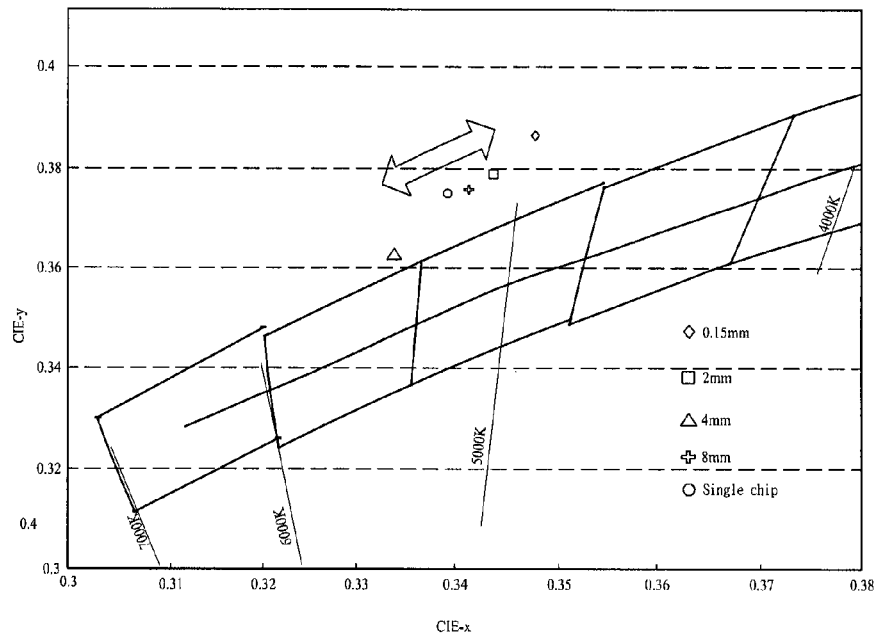
FIG. 4 shows a chromaticity diagram of second experiment disclosed in one embodiment of the present disclosure.

The measurement result of Experiment 2 is similar to the measurement result of Experiment 1. The cause of the decrease of the flux of radiation and the change of the overall color temperature is also the same as that of the Experiment 1. FIG. 4 shows a chromaticity diagram according to the data in Table 3. When the space is decreased, the overall color temperature is decreased; when the space is increased, the overall color temperature is gradually increased. Therefore, if comparing the color temperature of a single LED unit with the overall color temperature of four LED units arranged with different spaces in Experiment 2, the measurement result can confirm that by adjusting different spaces between every two adjacent LED units the overall color temperature can be adjusted effectively and the LED devices can be set to follow a predetermined temperature.

Experiment 3: The size of the LED unit is 2 mm*1 mm, the type of the LED unit is warm white LED, and the spaces D between every two adjacent LED units for test are 0 mm (a single LED unit), 0.15 mm, 2 mm, 4 mm, and 8 mm.

Table 4 shows the data of Experiment 3 including a single LED unit and four LED units arranged with different spaces. When the space D is increased from 0.15 mm to 8 mm, the overall color temperature is increased by about 25K while the flux of radiation is increased with the space D. The luminous flux variation stands little change and is about 3%.

TABLE 4

| | Experiment 3 | | | | | | | | | |
|---|---|---|---|---|---|---|---|---|---|---|
| Space [mm] | Luminous Flux variation [Lumen] | Flux of radiation [W] | Color temperature [K] | CIE x | CIE y | CIE u' | CIE v | Ra | Voltage [V] | Current [A] |
| Single chip | 32.75 | 0.11 | 2512 | 0.48 | 0.42 | 0.27 | 0.53 | 84.65 | 3.09 | 0.12 |
| 0.15 | 285.85 | 0.93 | 2492 | 0.48 | 0.48 | 0.27 | 0.53 | 84.20 | 9.15 | 0.36 |
| 2.0 | 286.75 | 0.94 | 2507 | 0.48 | 0.42 | 0.27 | 0.53 | 85.10 | 9.20 | 0.36 |
| 4.0 | 294.35 | 0.96 | 2516 | 0.48 | 0.42 | 0.27 | 0.53 | 85.10 | 9.45 | 0.36 |
| 8.0 | 294.72 | 0.96 | 2517 | 0.48 | 0.41 | 0.27 | 0.53 | 85.30 | 9.17 | 0.36 |

Figure 5:
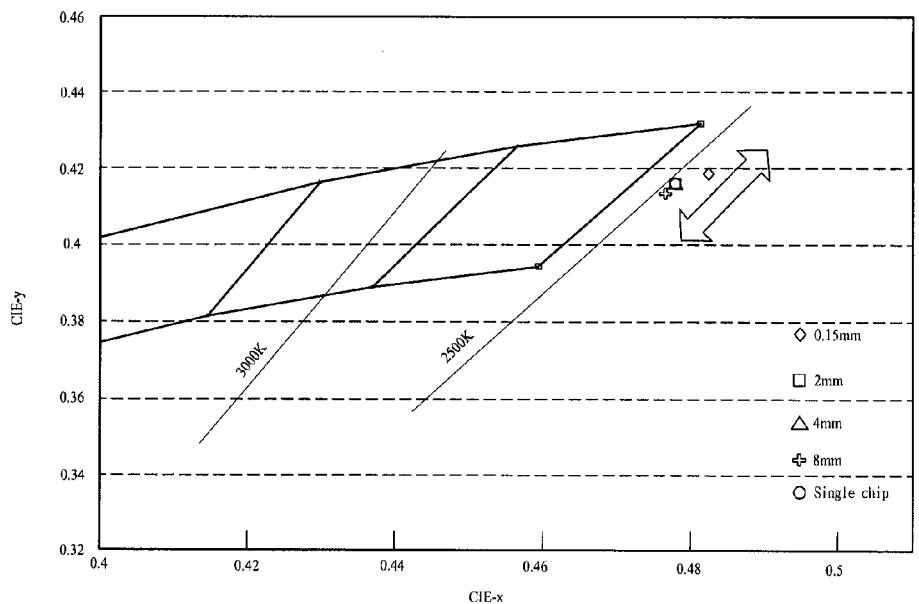
FIG. 5 shows a chromaticity diagram of third experiment disclosed in one embodiment of the present disclosure.

The measurement result of Experiment 3 shows when the space is decreased, similar to the measurement result of Experiment 1 and Experiment 2, the flux of radiation is decreased. FIG. 5 shows a chromaticity diagram according to the data in Table 4. When the space is decreased, the drift of the overall color temperature in Experiment 3 is smaller than that in Experiments 1 and 2. The cause of the result is that the Experiment 3 uses warm white LED unit and the fluorescent powder in warm white LED unit is less than that in cold white LED unit. Therefore, the proportion of blue light at lateral side in Experiment 3 is lower. When the arrangement of LED units is more intensive, it is much harder for the LED units to be affected by fluorescent powder of adjacent LED unit and to generate secondary absorption effect of blue light comparing to those LED units arranged loosely.

Experiment 4: The size of the LED unit is 2 mm*2 mm, the type of the LED unit is warm white LED, and the spaces D between every two adjacent LED units for test are 0 mm (a single LED unit), 0.15 mm, 2 mm, 4 mm, and 8 mm.

Table 5 shows the data of Experiment 4 including a single LED unit and four LED units arranged with different spaces. When the space D is increased from 0.15 mm to 8 mm, the overall color temperature is increased by about 98K while the flux of radiation is increased with the space D. The luminous flux variation stands little change and is about 3%.

TABLE 5

| | Experiment 4 | | | | | | | | | |
|---|---|---|---|---|---|---|---|---|---|---|
| Space [mm] | Luminous Flux variation [Lumen] | Flux of radiation [W] | Color temperature [K] | CIE x | CIE y | CIE u' | CIE v | Ra | Voltage [V] | Current [A] |
| Single chip | 92.38 | 0.28 | 2845 | 0.46 | 0.42 | 0.26 | 0.53 | 79.45 | 3.13 | 0.35 |
| 0.15 | 801.58 | 2.46 | 2771 | 0.46 | 0.42 | 0.26 | 0.53 | 79.71 | 9.68 | 1.05 |
| 2.0 | 821.14 | 2.52 | 2836 | 0.45 | 0.42 | 0.26 | 0.53 | 80.10 | 9.62 | 1.05 |
| 4.0 | 833.66 | 2.55 | 2845 | 0.45 | 0.42 | 0.26 | 0.53 | 79.95 | 9.98 | 1.05 |
| 8.0 | 826.36 | 2.52 | 2859 | 0.45 | 0.42 | 0.26 | 0.53 | 80.15 | 9.78 | 1.05 |

Figure 6:
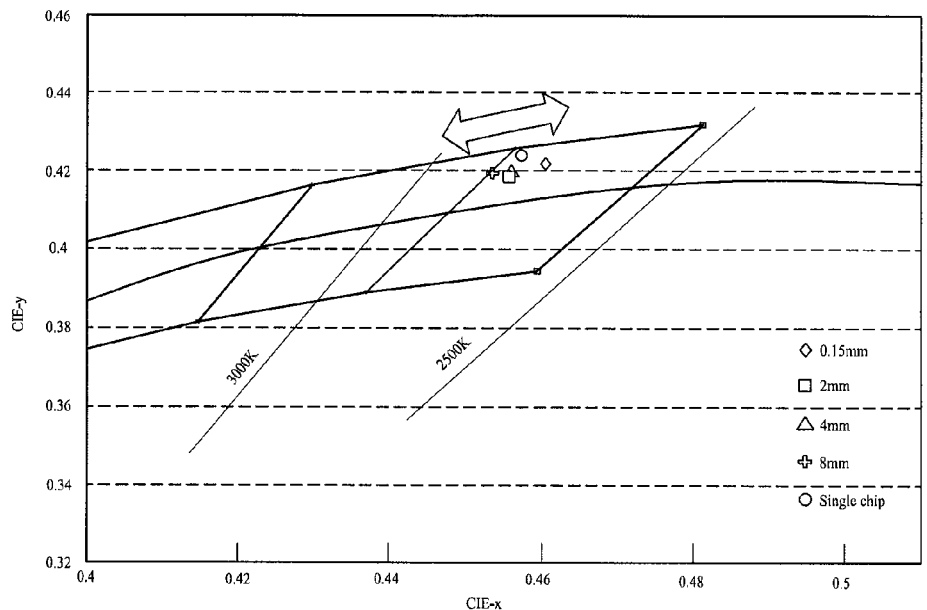
FIG. 6 shows a chromaticity diagram of fourth experiment disclosed in one embodiment of the present disclosure.

The measurement result of Experiment 4 is similar to the measurement result of Experiment 3. The cause of the decrease of the flux of radiation and the change of the overall color temperature are also the same as that of the Experiment 3. FIG. 6 shows a chromaticity diagram according to the data in Table 5. In Experiments 3 and 4, although the LED units arranged with different spaces have less effect on the color temperature than that in the Experiment 1 and 2, there is still a small amount of drift in color temperature. Therefore, by adjusting different spaces between every two adjacent LED units the overall color temperature can be adjusted effectively and the LED devices can be set to follow a predetermined temperature.

As mentioned above, according to the measurement results of the Experiments 1 to 4, when the space D is increased from 0.15 mm to 8 mm, the change of the luminous flux variation is about 0.2%~3.0%, the change of the overall color temperature is about 25K~340K, and the flux of radiation is gradually increased.

Figure 7A:
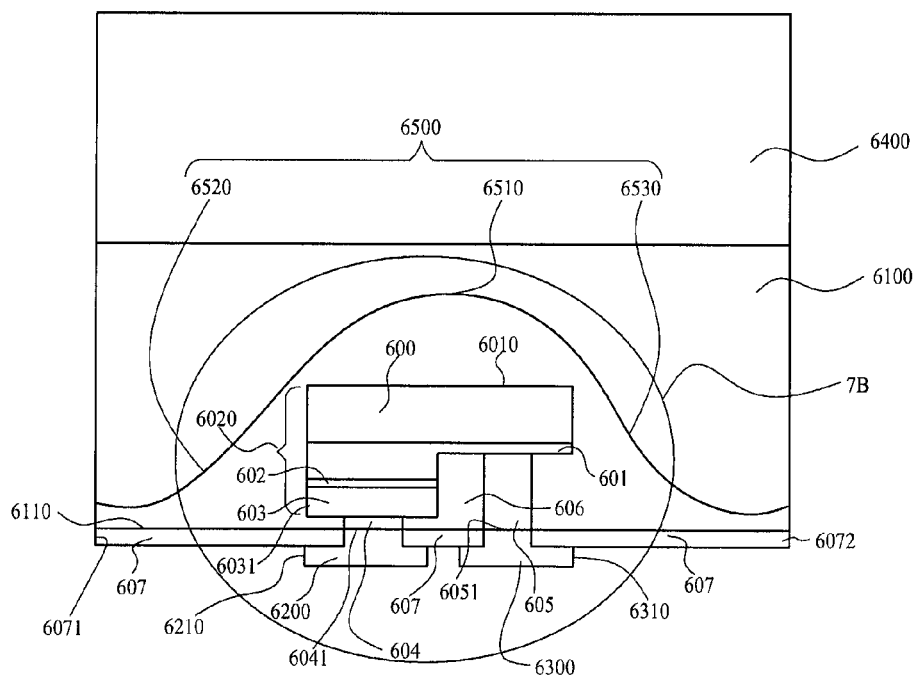
FIG. 7A shows a cross section of a light-emitting device disclosed in one embodiment of the present disclosure.

FIG. 7A shows a cross section of LED unit 20 disclosed in above embodiments. The LED unit 20 includes a light-emitting body comprising a substrate 600, a first-type semiconductor layer 601, an active layer 602, and a second-type semiconductor layer 603. The first-type semiconductor layer 601 and the second-type semiconductor layer 603 can be a cladding layer or a confinement layer which respectively provide electrons and holes such that electrons and holes can be recombined in the active layer 602 to emit light. A first conductive portion 604 and a second conductive portion 605 are formed on the second-type semiconductor layer 603 and the first-type semiconductor layer 601, respectively. In present embodiment, the LED unit 20 is a flip-chip light-emitting diode unit. A space 606 is formed between the first conductive portion 604 and the second conductive portion 606. The first conductive portion 604 has a contact surface 6041 and the second conductive portion 605 has a contact surface 6051 which is substantially coplanar with the contact surface 6041. A transparent substance covers the substrate 600, the first-type semiconductor layer 601, the active layer 602, and the second-type semiconductor layer 603 and further fills up the space 606 to form a first transparent structure 6100. In another embodiment, the transparent substance does not fill up the space 606, and there may be air between the first conductive portion 604 and the second conductive portion 605. The first transparent structure 6100 has a surface 6110 substantially coplanar with the contact surfaces 6041, 6051. Subsequently, a protective layer 607 is formed on a surface of the first transparent structure 6100 to expose the first conductive portion 604 and the second conductive portion 605. A first expansion electrode portion 6200 and a second expansion electrode portion 6300 are formed on and electrically connected to the first conductive portion 604 and the second conductive portion 605 respectively, and further formed on the protective layer 607. The first expansion electrode 6200 and the second expansion electrode 6300 electrically connect with the first conductive portion 604 and the second conductive portion 605 respectively. In this embodiment, the first expansion electrode portion 6200 has a sidewall 6210 which is not coplanar with a sidewall 6071 of the protective layer 607; the second expansion electrode portion 6300 has a sidewall 6310 which is not coplanar with another sidewall 6072 of the protective layer 607. In other embodiment, the sidewall 6210 of the first expansion electrode portion 6200 can be coplanar with a sidewall 6071 of the protective layer 607; the sidewall 6310 of the second expansion electrode portion 6300 can be coplanar with another sidewall 6072 of the protective layer 607. The LED unit 600 further includes a second transparent structure 6400 formed on the first transparent structure 6100. The first transparent structure 6100 includes silicone, epoxy, polyimide (PI), BCB, perfluorocyclobutane (PFCB), SU8, acrylic resin, polymethyl methacrylate (PMMA), polyethylene terephthalate (PET), polycarbonate (PC), polyether-imide, fluorocarbon polymer, $Al_2O_3$, SINR, or spin-on-glass (SOG). The second transparent structure 6400 can include sapphire, diamond, glass, epoxy, quartz, acryl resin, $SiO_x$, $Al_2O_3$, ZnO, silicone, and/or any combination thereof.

Figure 7B:
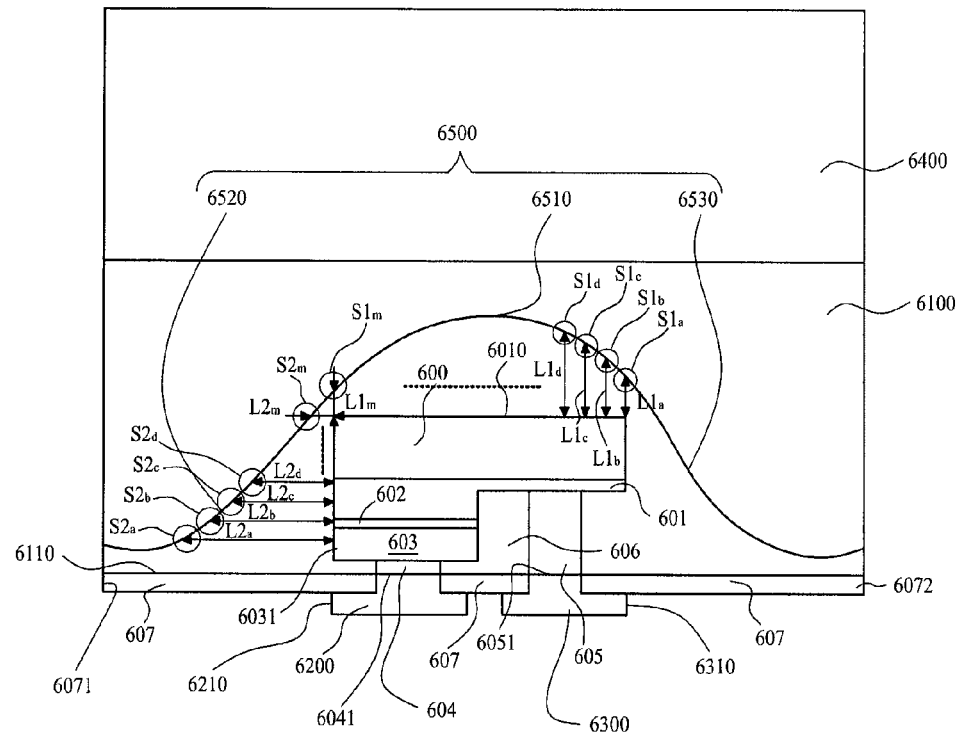
FIG. 7B shows an enlarged view of a portion of FIG. 7A.

The LED unit 20 can further include a wavelength conversion layer 6500 formed by a plurality of particles of wavelength conversion material and including a first region of wavelength conversion layer 6510, a second region of wavelength conversion layer 6520, and a third region of wavelength conversion layer 6530. The wavelength conversion layer 6500 is distributed in the first transparent structure 6100 in a shape of curve. The first region of wavelength conversion layer 6510 is formed on the substrate 600, the second region of wavelength conversion layer 6520 and the third region of wavelength conversion layer 6530 are distributed on the two side walls of the substrate 600, the first-type semiconductor layer 601, the active layer 602, the second-type semiconductor layer 603, the first conductive portion 604, and the second conductive portion 605. As shown in FIG. 7B, there is a first distance (such as $L1_a$, $L1_b$, $L1_c$, $L1_d$ ... $L1_m$) which is the shortest distance between each middle points of the particles (such as $S1_a$, $S1_b$, $S1_c$, $S1_d$ ... $S1_m$) of the first region of wavelength conversion layer 6510 and the upper surface 6010 of the substrate 600, and a first average distance $L1_{ave}$ between the first region of wavelength conversion layer 6510 and the upper surface of the substrate is defined as $(L1_a+L1_b+L1_c+ ... L1_m)/(S1_a+S1_b+S1_c+ ... S1_m)$. There is a second distance (such as $L2_a$, $L2_b$, $L2_c$, $L2_d$ ... $L2_m$) which is the shortest distance between each middle points of the particles (such as $S2_a$, $S2_b$, $S2_c$, $S2_d$ ... $S2_m$) of the second region of wavelength conversion layer 6520 and a side surface 6020, and a second average distance $L2_{ave}$ between the second region of wavelength conversion layer 6520 and the side surface 6020 is defined as $(L2_a+L2_b+L2_c+ ... L2_m)/(S2_a+S2_b+S2_c+ ... S2_m)$. In the present embodiment, the first average distance $L1_{ave}$ is equal to the second average distance $L2_{ave}$, and the second region of wavelength conversion layer 6520 and a third region of wavelength conversion layer 6530 are bilateral symmetry to uniform the overall color temperature of the light-emitting device.

The aforesaid LED unit 20 can have five light-emitting surfaces and include one light-emitting diode or a plurality of light-emitting diodes. The wavelength conversion layer 6500 can be used to convert the light from the active layer. A portion of the light (ex. blue light) emitted from the LED unit is converted to another light (ex. yellow or yellowish-green light) by the wavelength conversion layer. The blue light is mixed with the yellow light (or yellowish-green light) to form a white light. The protective layer 607 of the LED unit 20 can be a reflective layer which reflects light from the LED unit toward the substrate.

Figure 8:
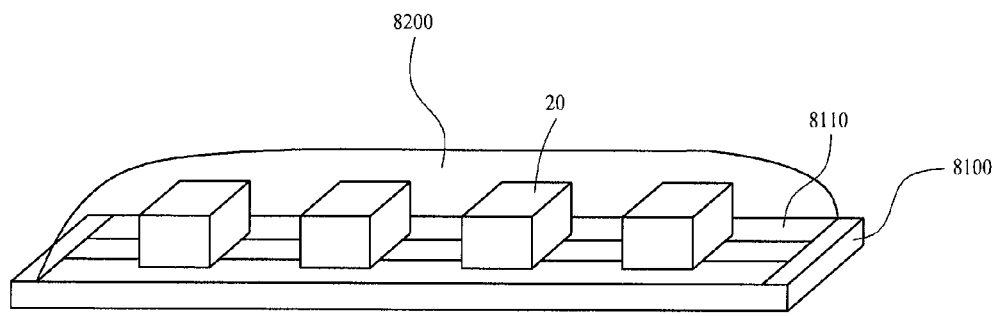
FIG. 8 shows a view of light-emitting device disclosed in another embodiment of present disclosure.

As shown in FIG. 8, in another embodiment, the LED unit 20 is arranged on the top surface 8110 of the carrier 8100 and the carrier can be a transparent carrier. In this embodiment, an LED device 800 further includes a transparent carrier of the wavelength conversion layer 8200 formed on the LED unit 20 and at least a portion of transparent carrier 8100. Portions of the white light can be scattered or reflected by the particles within the wavelength conversion layer (or the wavelength conversion material) to be incident on the transparent carrier such that the white light not only emits outwardly through a side (top surface) of the transparent carrier on which the LED unit is arranged, but also emits outwardly through a side surface and a bottom surface of the transparent carrier, which indicates the white light can emit outwardly through all surfaces of the carrier (defined as a six-surface light-emitting device). In addition, a diffusing powder (ex. $TiO_2$) is optionally added into the wavelength conversion layer (or the wavelength conversion material) for increasing the possibility for the white light to progress downward. In short, in this embodiment, an approximately uniform light distribution (can be seen as a six-surface light-emitting device) can be achieved by using a non-uniform light source (such as five-surface light-emitting diode).

Although the drawings and the illustrations shown above are corresponding to the specific embodiments individually, the unit, the practicing method, the designing principle, and the technical theory can be referred, exchanged, incorporated, collocated, coordinated except they are conflicted, incompatible, or hard to be put into practice together. Although the present application has been explained above, it is not the limitation of the range, the sequence in practice, the material in practice, or the method in practice. Any modification or decoration for present application is not detached from the spirit and the range of such.

The invention claimed is:

1. A method of tuning color temperature of light-emitting device having an overall color temperature, comprising:
   providing a carrier;
   disposing at least two light-emitting diode (LED) units on the carrier, wherein there is a space formed between the at least two LED units, and the overall color temperature of the light-emitting device is positively correlated to the space; and
   setting a predetermined temperature for the overall color temperature by adjusting the space.

2. The method of claim 1, wherein the overall color temperature of the light-emitting device is increased with the space, and/or the overall color temperature of the light-emitting device is decreased with the space.

3. The method of claim 1, further comprising measuring the overall color temperature of the light-emitting device.

4. The method of claim 1, wherein there is a flux of radiation of the light-emitting device increased with the space.

5. The method of claim 1, wherein the space is between 0.15 mm to 8 mm.

6. The method of claim 5, wherein there is a luminous flux variation of the light-emitting device and the luminous flux variation is about 0.2%~3.0%.

7. The method of claim 5, wherein there is a change of the overall color temperature and the change is about 25K~340K.

8. The method of claim 1, wherein the LED unit comprises a side surface for emitting light outwardly.

9. The method of claim 1, wherein the LED unit comprises:
   a light-emitting body;
   a first transparent structure covering the light-emitting body;
   a second transparent structure arranged on the first transparent structure; and
   a conductive portion arranged under the light-emitting body and electrically connected to the light-emitting body.

10. The method of claim 9, wherein the LED unit further comprises:
    a wavelength conversion layer formed between the light-emitting body and the second transparent layer.

* * * * *